US012665535B2

(12) United States Patent (10) Patent No.: US 12,665,535 B2
Masood et al. (45) Date of Patent: Jun. 23, 2026

(54) SYSTEM AND METHOD FOR MODIFIED ACTIVE ZERO SPACE VECTOR PULSE WIDTH MODULATION

(71) Applicant: Franklin Electric Co., Inc., Fort Wayne, IN (US)

(72) Inventors: Amjad Masood, Fort Wayne, IN (US); Benjamin Hunley, Fort Wayne, IN (US); Bart Long, Fort Wayne, IN (US)

(73) Assignee: Franklin Electric Co., Inc., Fort Wayne, IN (US)

( * ) Notice: Subject to any disclaimer, the term of this patent is extended or adjusted under 35 U.S.C. 154(b) by 256 days.

(21) Appl. No.: 18/634,575

(22) Filed: Apr. 12, 2024

(65) Prior Publication Data

US 2025/0183835 A1     Jun. 5, 2025

Related U.S. Application Data

(60) Provisional application No. 63/606,377, filed on Dec. 5, 2023.

(51) Int. Cl.
| | |
|---|---|
| B60L 53/68 | (2019.01) |
| H02P 27/08 | (2006.01) |
| H03K 5/156 | (2006.01) |

(52) U.S. Cl.
CPC ......... H02P 27/085 (2013.01); H03K 5/1565 (2013.01)

(58) Field of Classification Search
CPC ..... H02P 27/085; H03K 5/1565; B60L 53/68; G05F 1/66
See application file for complete search history.

(56) References Cited

U.S. PATENT DOCUMENTS

| | | | | |
|---|---|---|---|---|
| 5,754,036 A | * | 5/1998 | Walker | G05F 1/66 |
| | | | | 323/237 |
| 2017/0028853 A1 | * | 2/2017 | Elshaer | B60L 53/68 |

\* cited by examiner

*Primary Examiner* — Cortez M Cook
(74) *Attorney, Agent, or Firm* — Faegre Drinker Biddle & Reath LLP

(57) ABSTRACT

A method is provided for reducing common mode voltages in a system that includes an inverter connected to a motor by a long cable by controlling switches of the inverter to generate voltage vectors that emulate a three-phase sinusoidal waveform by switching between adjacent active vectors and active vectors that are separated by 180 degrees, determining whether a phase angle of the vectors is increasing or decreasing, determining a decision angle within the sector which is a function of a duty cycle offset and a modulation index; and applying duty cycle manipulation rules, including: responding to an increasing phase angle that is less than the decision angle by setting a duty cycle of the adjacent active vectors to a duty cycle high value; and responding to an increasing phase angle that is greater than 60 degrees minus the decision angle by setting the duty cycle to a low value.

20 Claims, 13 Drawing Sheets

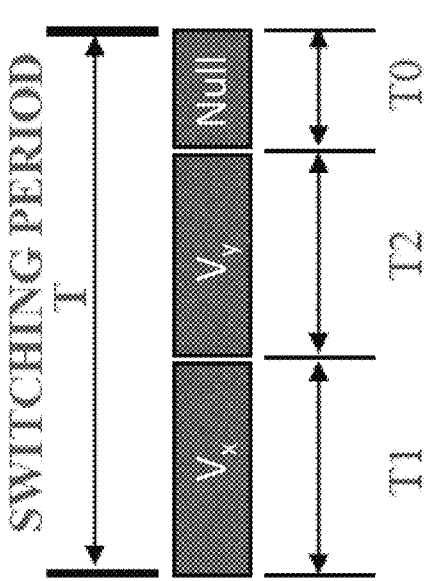
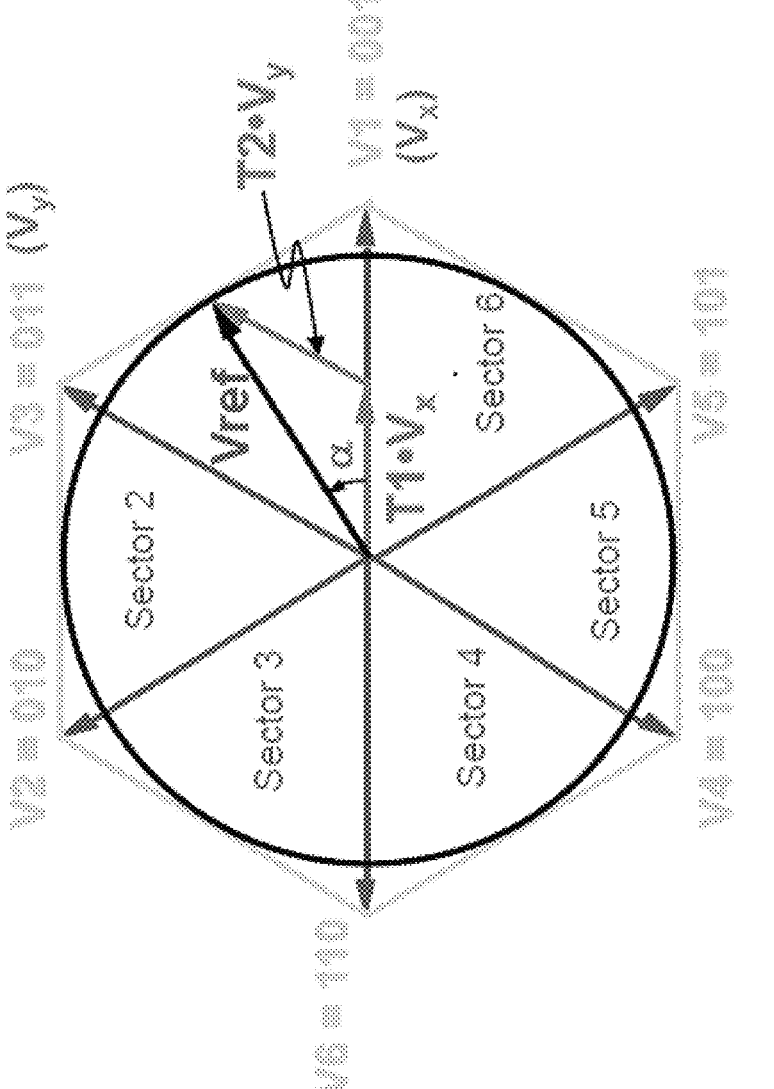
FIG. 6

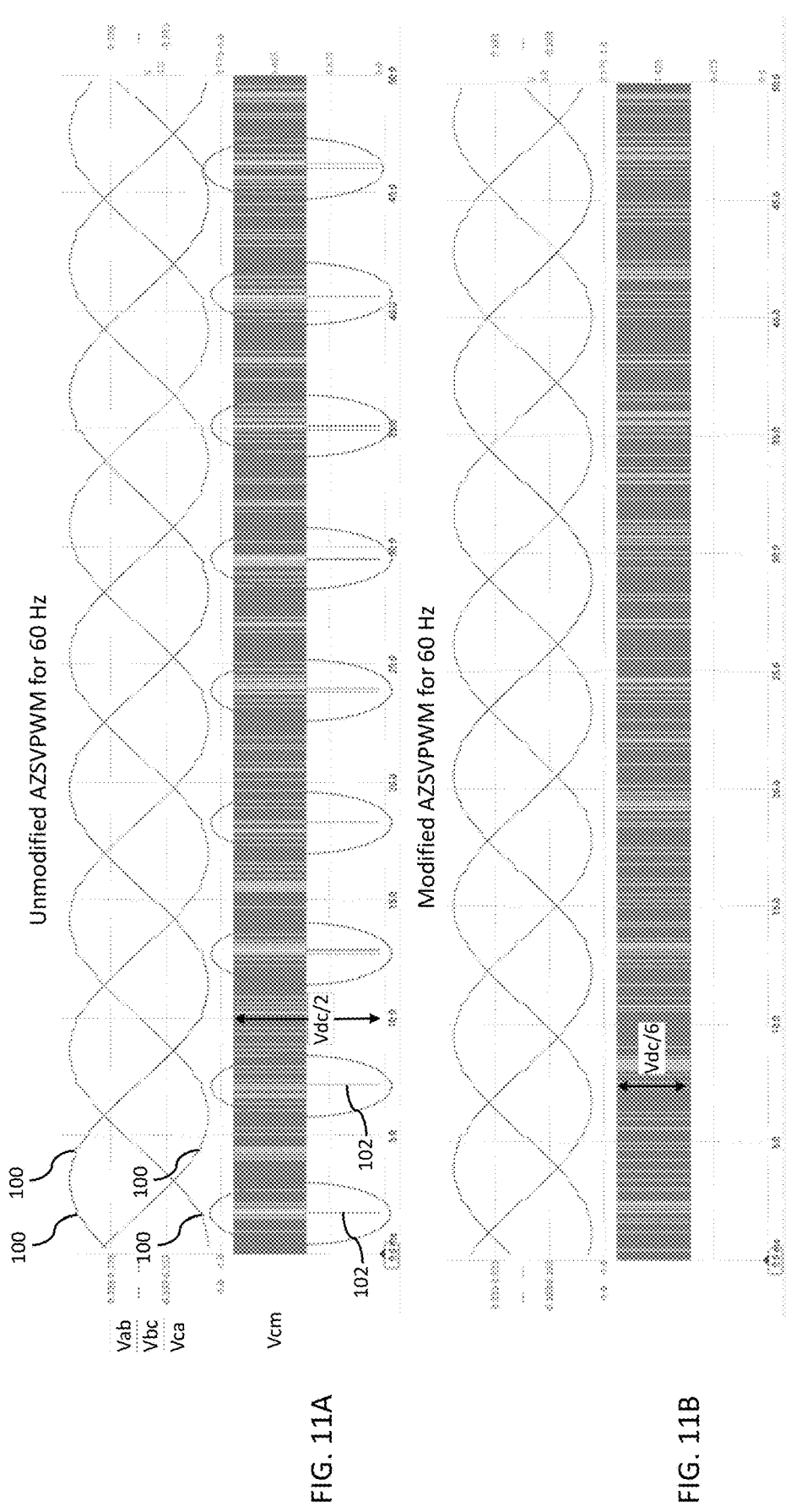

Voltage transition with $d_{ov} = 0.00$

Voltage transition with $d_{ov} = 0.08$

SYSTEM AND METHOD FOR MODIFIED ACTIVE ZERO SPACE VECTOR PULSE WIDTH MODULATION

FIELD

The present disclosure pertains to motor drives, and more particularly to control systems for variable frequency drives using a modified active zero space vector pulse width modulation technique to reduce common mode voltage and reflected voltage.

BACKGROUND

It is known to control the operation of a motor that drives a load (e.g., a pump) using a variable frequency drive that produces, using pulse width modulation, an emulated three-phase sinusoidal waveform that controls the speed of operation of the pump. In space vector pulse width modulation, the emulated three-phase sinusoidal waveform is generated by synthesizing the voltage magnitude and phase angle of three phase voltage vectors traversing through a space vector hexagon. However, because conventional space vector pulse width modulation uses zero vectors, the common mode voltage is in some instances unacceptably high. The common mode voltage may be reduced using active zero space vector pulse width modulation, which uses 180 degree opposite active vectors instead of zero vectors to synthesize reference voltage vectors. Nonetheless, when the voltage vector crosses from one sector to another in the space vector hexagon, there are instances of high common mode voltage for short durations of time. Additionally, high peak voltages may be experienced at the motor as a result of complementary switching of vectors. While these problems may in some applications be at least partially eliminated using hardware (e.g., large common mode chokes), such hardware is expensive and may be difficult to install due to size constraints. Accordingly, there exists a need to provide a control approach for a motor drive that reduces common mode voltage and high peak voltages without requiring additional hardware.

SUMMARY

According to one embodiment of the present disclosure, a method is provided for reducing common mode voltages in a three-phase pulse width modulated ("PWM") system that includes a controller and an inverter connected to a motor by a long cable, the method comprising: controlling, by the controller, operation of switches of the inverter to generate voltage vectors provided to the motor over the cable that emulate a three-phase sinusoidal waveform with an adjustable amplitude and an adjustable frequency, the voltage vectors being generated by switching between a pair of adjacent active vectors of a space vector hexagon and a pair of active vectors that are separated by 180 degrees on the space vector hexagon; determining, by the controller, whether a phase angle of the voltage vectors is increasing or decreasing within a sector of the space vector hexagon; determining, by the controller, a decision angle within the sector which is a function of a duty cycle offset and a modulation index; and comparing, by the controller, the phase angle to the decision angle to apply duty cycle manipulation rules, including: responding, by the controller, to an increasing phase angle that is less than the decision angle by setting a duty cycle of the pair of adjacent active vectors to a duty cycle high value; responding, by the controller, to an increasing phase angle that is greater than 60 degrees minus the decision angle by setting the duty cycle to a duty cycle low value; responding, by the controller, to a decreasing phase angle that is less than the decision angle by setting the duty cycle to the duty cycle low value; and responding, by the controller, to a decreasing phase angle that is greater than 60 degrees minus the decision angle by setting the duty cycle to the duty cycle high value. In one aspect of this embodiment, the cable is at least 50 feet long. In another aspect, the duty cycle high value and the duty cycle low value are each a function of the modulation index and the decision angle. In yet another aspect, determining whether the phase angle of the voltage vectors is increasing or decreasing within a sector of the space vector hexagon includes determining that the phase angle is increasing if 0 degrees is the beginning of the sector and 60 degrees is the end of the sector, and determining that the phase angle is decreasing if 60 degrees is the beginning of the sector and 0 degrees is the end of the sector. In another aspect of this embodiment, the method further comprises responding, by the controller, to an increasing phase angle that is greater than the decision angle and less than 60 degrees minus the decision angle by leaving the duty cycle unchanged, and responding, by the controller, to a decreasing phase angle that is greater than the decision angle and less than 60 degrees minus the decision angle by leaving the duty cycle unchanged. In another aspect, in sector one of the space vector hexagon the duty cycle manipulation rules are applied to a V phase of the three-phase sinusoidal waveform provided to the motor, in sector two of the space vector hexagon the duty cycle manipulation rules are applied to a U phase of the three-phase sinusoidal waveform provided to the motor, in sector three of the space vector hexagon the duty cycle manipulation rules are applied to a W phase of the three-phase sinusoidal waveform provided to the motor, in sector four of the space vector hexagon the duty cycle manipulation rules are applied to the V phase of the three-phase sinusoidal waveform provided to the motor, in sector five of the space vector hexagon the duty cycle manipulation rules are applied to the U phase of the three-phase sinusoidal waveform provided to the motor, and in sector six of the space vector hexagon the duty cycle manipulation rules are applied to the W phase of the three-phase sinusoidal waveform provided to the motor. In still another aspect, the duty cycle offset is selected to reduce a peak voltage at the motor for a certain operating frequency of the motor. Another aspect further comprises sweeping a value of the duty cycle offset over a range of values corresponding to a linear curve based upon a speed of the motor.

According to another embodiment, the present disclosure provides a system for reducing common mode voltages in a three-phase pulse width modulated ("PWM") system for a motor, comprising: a controller; a memory device storing instructions; and an inverter controlled by the controller according to the instructions; wherein execution of the instructions by the controller causes the controller to: control operation of switches of the inverter to generate voltage vectors provided to the motor over a cable that emulate a three-phase sinusoidal waveform with an adjustable amplitude and an adjustable frequency, the voltage vectors being generated by switching between a pair of adjacent active vectors of a space vector hexagon and a pair of active vectors that are separated by 180 degrees on the space vector hexagon; determine whether a phase angle of the voltage vectors is increasing or decreasing within a sector of the space vector hexagon; determine a decision angle within the sector which is a function of a duty cycle offset and a modulation index; and compare the phase angle to the decision angle to apply duty cycle manipulation rules, including: responding to an increasing phase angle that is less than the decision angle by setting a duty cycle of the pair of adjacent active vectors to a duty cycle high value; responding to an increasing phase angle that is greater than 60 degrees minus the decision angle by setting the duty cycle to a duty cycle low value; responding to a decreasing phase angle that is less than the decision angle by setting the duty cycle to the duty cycle low value; and responding to a decreasing phase angle that is greater than 60 degrees minus the decision angle by setting the duty cycle to the duty cycle high value. In one aspect of this embodiment, the cable is at least 50 feet long. In another aspect, the duty cycle high value and the duty cycle low value are each a function of the modulation index and the decision angle. In yet another aspect, execution by the controller of the instructions causes the controller to determine whether the phase angle of the voltage vectors is increasing or decreasing within a sector of the space vector hexagon by determining that the phase angle is increasing if 0 degrees is the beginning of the sector and 60 degrees is the end of the sector, and determining that the phase angle is decreasing if 60 degrees is the beginning of the sector and 0 degrees is the end of the sector. In a further aspect of this embodiment, execution by the controller of the instructions further causes the controller to respond to an increasing phase angle that is greater than the decision angle and less than 60 degrees minus the decision angle by leaving the duty cycle unchanged, and respond to a decreasing phase angle that is greater than the decision angle and less than 60 degrees minus the decision angle by leaving the duty cycle unchanged. In yet another aspect, in sector one of the space vector hexagon the controller applies the duty cycle manipulation rules to a V phase of the three-phase sinusoidal waveform provided to the motor, in sector two of the space vector hexagon the controller applies the duty cycle manipulation rules to a U phase of the three-phase sinusoidal waveform provided to the motor, in sector three of the space vector hexagon the controller applies the duty cycle manipulation rules to a W phase of the three-phase sinusoidal waveform provided to the motor, in sector four of the space vector hexagon the controller applies the duty cycle manipulation rules to the V phase of the three-phase sinusoidal waveform provided to the motor, in sector five of the space vector hexagon the controller applies the duty cycle manipulation rules to the U phase of the three-phase sinusoidal waveform provided to the motor, and in sector six of the space vector hexagon the controller applies the duty cycle manipulation rules to the W phase of the three-phase sinusoidal waveform provided to the motor. In another aspect, the duty cycle offset is selected to reduce a peak voltage at the motor for a certain operating frequency of the motor. In still another aspect, execution of the instructions by the controller further causes the controller to sweep a value of the duty cycle offset over a range of values corresponding to a linear curve based upon a speed of the motor.

In yet another embodiment, the present disclosure provides a non-transitory computer-readable medium with an executable program stored thereon for reducing common mode voltages in a three-phase pulse width modulated ("PWM") system that includes an inverter connected to a motor by a long cable, wherein the program instructs a controller to perform the following steps: controlling operation of switches of the inverter to generate voltage vectors provided to the motor over the cable that emulate a three-phase sinusoidal waveform with an adjustable amplitude and an adjustable frequency, the voltage vectors being generated by switching between a pair of adjacent active vectors of a space vector hexagon and a pair of active vectors that are separated by 180 degrees on the space vector hexagon; determining whether a phase angle of the voltage vectors is increasing or decreasing within a sector of the space vector hexagon; determining a decision angle within the sector which is a function of a duty cycle offset and a modulation index; and comparing the phase angle to the decision angle to apply duty cycle manipulation rules, including: responding to an increasing phase angle that is less than the decision angle by setting a duty cycle of the pair of adjacent active vectors to a duty cycle high value; responding to an increasing phase angle that is greater than 60 degrees minus the decision angle by setting the duty cycle to a duty cycle low value; responding to a decreasing phase angle that is less than the decision angle by setting the duty cycle to the duty cycle low value; and responding to a decreasing phase angle that is greater than 60 degrees minus the decision angle by setting the duty cycle to the duty cycle high value. In one aspect of this embodiment, the duty cycle high value and the duty cycle low value are each a function of the modulation index and the decision angle. In another aspect, the program further instructs the controller to determine whether the phase angle of the voltage vectors is increasing or decreasing within a sector of the space vector hexagon by determining that the phase angle is increasing if 0 degrees is the beginning of the sector and 60 degrees is the end of the sector, and determining that the phase angle is decreasing if 60 degrees is the beginning of the sector and 0 degrees is the end of the sector. In yet another aspect, the program further instructs the controller to sweep a value of the duty cycle offset over a range of values corresponding to a linear curve based upon a speed of the motor.

BRIEF DESCRIPTION OF THE DRAWINGS

The above-mentioned and other advantages and objects of this disclosure, and the manner of attaining them, will become more apparent, and the disclosure itself will be better understood, by reference to the following description of embodiments of the invention taken in conjunction with the accompanying drawings, wherein:

FIGS. 5 and 6 are space vector diagrams illustrating the eight possible switch configurations for a three-leg inverter using space vector pulse width modulation;

FIG. 11A is a plot of example waveforms for 60 Hertz operation for each standard active zero space vector pulse width modulation output signal along with the corresponding common mode voltage values;

FIG. 11B is a plot of example waveforms similar to those of FIG. 11A but modified using duty cycle manipulation rules according to the present disclosure, resulting in reduced common mode voltages;

Figure 1:
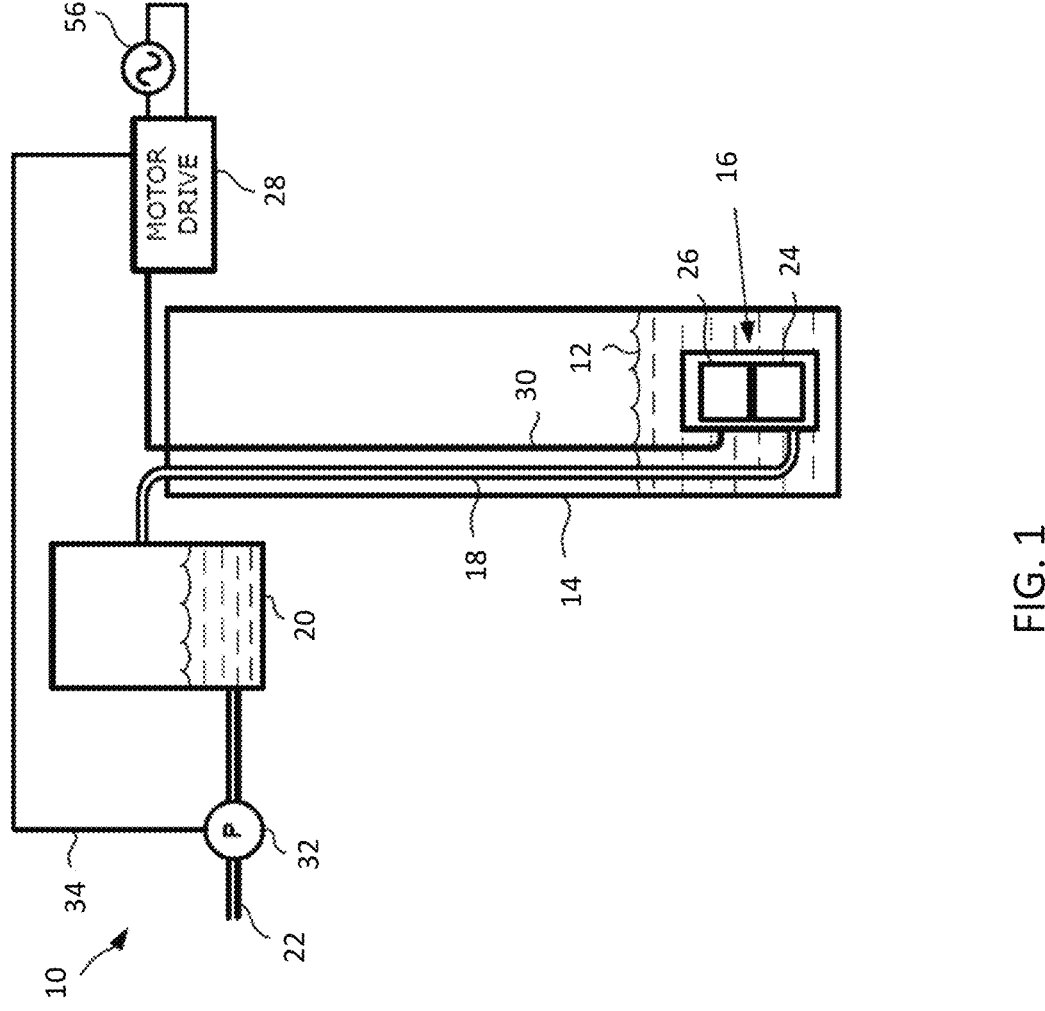
FIG. 1 is a conceptual view of a pump system.

Corresponding reference characters indicate corresponding parts throughout the several views. Although the drawings represent embodiments of the present disclosure, the drawings are not necessarily to scale, and certain features may be exaggerated or omitted in some of the drawings in order to better illustrate and explain the present disclosure.

DETAILED DESCRIPTION

Referring to FIG. 1, a diagrammatic representation of a liquid supply or pump system 10 is shown. Example liquids include water, gasoline fuel, diesel fuel, petroleum, oil, sewage, and combinations of such liquids with gases and solids, such as water and coal-based methane gas. In the description below, the liquid is referred to as water 12 and the pump is described as a deep well pump. The teachings of the present disclosure, however, apply to a variety of different applications. The liquid supply system 10 comprises a reservoir 14 containing water 12 which is pumped by a pump unit 16 through a conduit 18, optionally via another reservoir 20, e.g., a pressure tank, to a conduit 22 of a closed system. The submersible or immersive pump unit 16 includes a pump 24 driven by a motor 26 which is powered by a motor drive 28 via power conductors 30. The size of reservoir 14, which is interposed between pump unit 16 and a pressure sensor or transducer 32, affects the response of the system. In one example, the motor drive 28 is a variable frequency drive and pump 24 is a centrifugal pump. Motor drive 28 may be referred to hereinafter as "the VFD." Power conductors 30 may comprise two or more wires to provide single or three phase power to motor 26.

During operation of the system, water 12 flows out of conduit 18. For example, the system may be a water system in a home, in which case water flows out of conduit 22 when a faucet is opened or an irrigation system is turned on. Fluid characteristics including pressure may be monitored with the pressure sensor 32 disposed in conduit 22 to generate a pressure signal useful to maintain pressure about a setpoint. The pressure signal is provided via line 34 connecting the pressure sensor 32 and the motor drive 28.

Although the embodiments may be described with reference to liquids, particularly water, the invention is not so limited. Generally, the embodiments are applicable to any rotary fluid displacement machine driven by a motor with a variable speed drive, including a variable frequency drive. As used herein rotary fluid displacement machines include pumps, fans, ventilators, turbines, radial compressors and other machines having a rotating element provided to displace a fluid.

Figure 2:
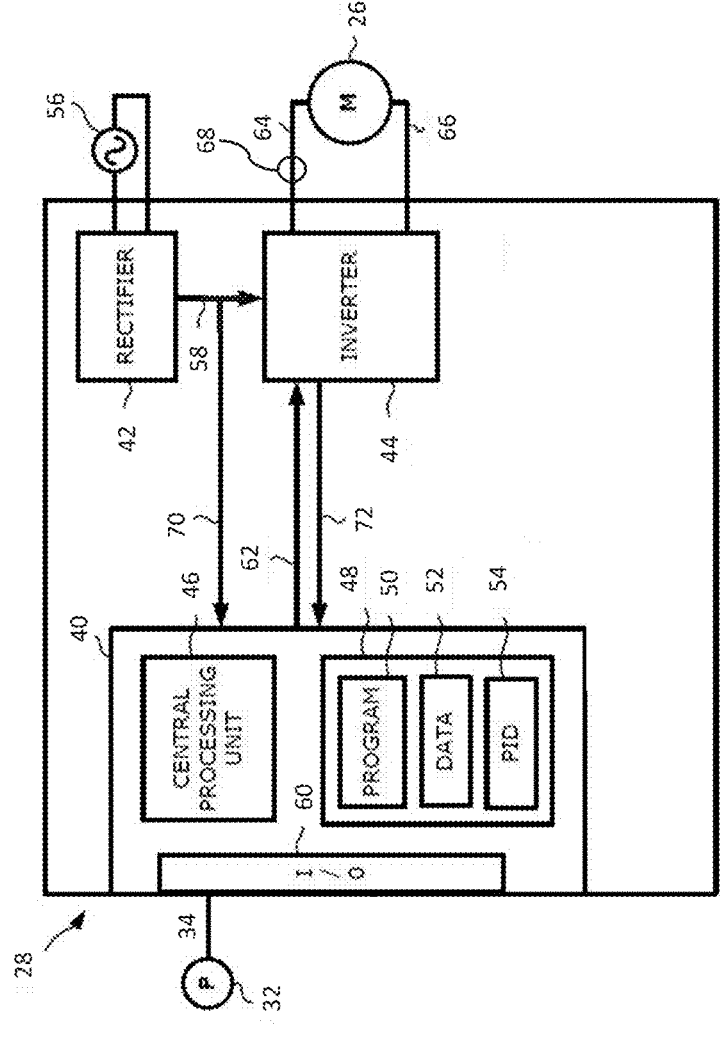
FIG. 2 is a block diagram of a motor drive for use with the pump system of FIG. 1.

FIG. 2 illustrates an embodiment of motor drive 28 comprising a processing device, illustratively controller 40, a rectifier 42 and an inverter 44. As shown, controller 40 includes a CPU 46 configured to access a memory device 48 and execute processing instructions from a program module, exemplified by program 50, based on data 52. Another example of a program module is shown as PID module 54. PID module 54 may also be comprised in a hardware module communicatively coupled to CPU 46.

Techniques for generating motor voltages according to characteristics of a control signal are known in the art. In one example, a technique comprises storing values in a table corresponding to samples of an operating curve. The operating curve is typically a substantially straight line defining a volts-hertz relationship. When the speed control system determines a desired operating speed, which defines an operating frequency, the motor drive 28 looks up a voltage corresponding to the frequency. The motor drive 28 then generates a motor voltage based on the voltage and the frequency. In another example, a formula or a function embodying the operating curve characteristics is used by CPU 46 to generate the desired motor voltages.

Rectifier 42 is powered by a power source 56 and includes any rectification circuit well known in the art, e.g., a diode bridge, to convert three phase alternating-current (AC) voltage supplied by the power source 56 into direct-current (DC) voltage which it supplies, after smoothing, to the inverter 44. The rectifier 42 includes a plurality of diodes connected in parallel which allow the positive portions of the three phase AC voltage to pass to the inverter 44. The inverter 44 receives DC power from the rectifier 42 through a conductor 58 and converts the DC power into an AC motor power. The power source 56 may comprise a single phase two-wire supply, a single phase three-wire supply, or a three-phase supply.

The CPU 46 receives inputs through an I/O interface 60 and outputs a control signals over line 62 to the inverter 44. In one example, the control signal, e.g., speed reference, is provided to a pulse-width-modulated (PWM) module having power switches and control logic which generates the appropriate gating signals for the power switches to convert the DC power supplied by the rectifier 42 to the AC motor voltage suitable to drive the motor 26 according to the control signal, provided to the motor 26 via conductors 64, 66 which may be housed within a long cable as is further described below. Current drawn by the motor 26 from the inverter 44 is sensed by a current sensor 68 and a current signal is provided by the current sensor 68 to the CPU 46. Motor voltage feedback can also be provided, for example through conductor 72 connecting the inverter 44 and the controller 40. Motor voltages may also be generated with other known or later developed drive topologies programmed in accordance with embodiments of the disclosure.

In a more general embodiment, the controller comprises control logic operable to generate the control signal. The term "logic" as used herein includes software and/or firmware executing on one or more programmable processors, application-specific integrated circuits, field-programmable gate arrays, digital signal processors, hardwired logic, or combinations thereof. Therefore, in accordance with the embodiments, various logic may be implemented in any appropriate fashion and would remain in accordance with the embodiments herein disclosed. A non-transitory machine-readable medium comprising logic can additionally be considered to be embodied within any tangible form of a computer-readable carrier, such as solid-state memory, magnetic disk, and optical disk containing an appropriate set of computer instructions and data structures that would cause a processor to carry out the techniques described herein. A non-transitory computer-readable medium, or memory, may include random access memory (RAM), read-only memory (ROM), erasable programmable read-only memory (e.g., EPROM, EEPROM, or Flash memory), or any other tangible medium capable of storing information.

Figure 3:
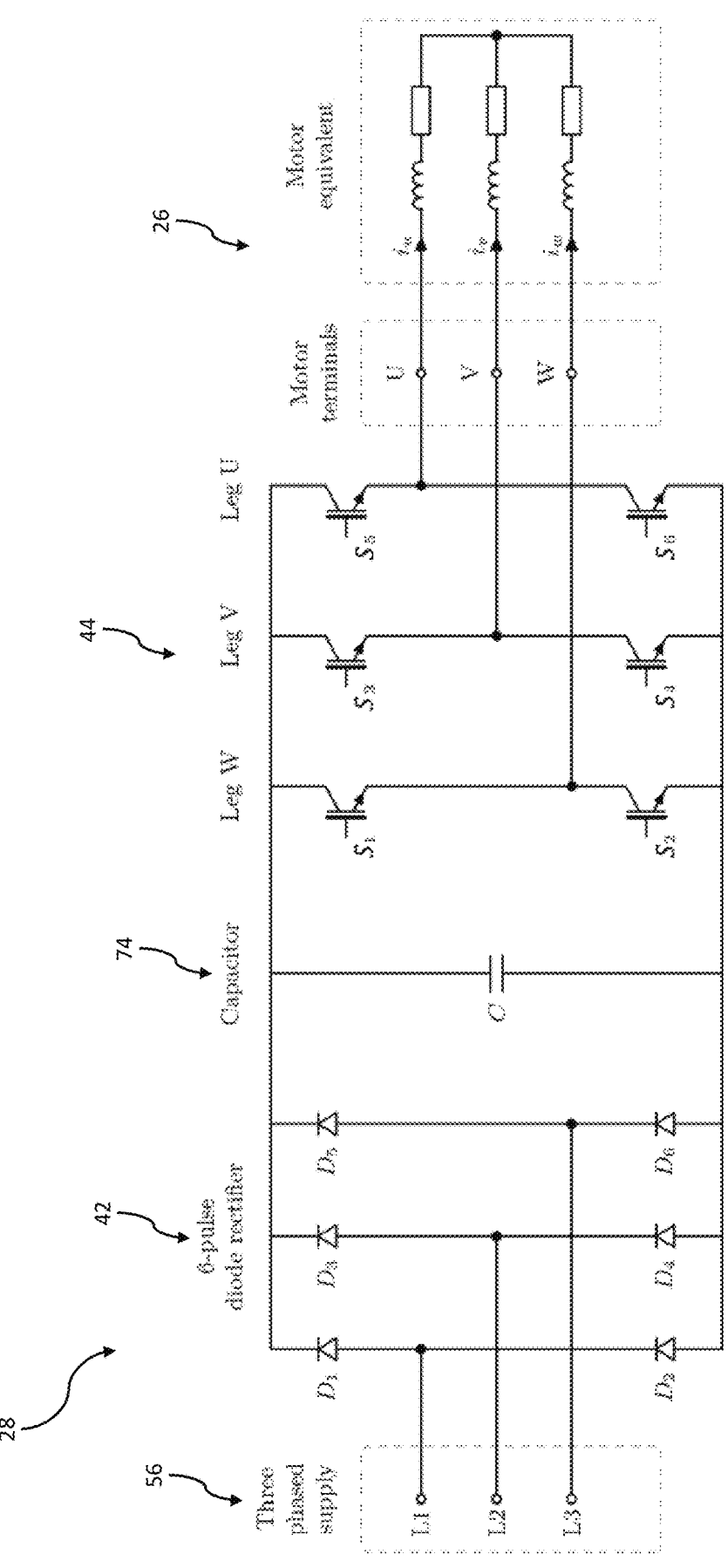
FIG. 3 is a schematic diagram of a prior art inverter topology for a motor drive.

Referring now to FIG. 3, a known inverter topology for the motor drive 28 is shown. Three phase AC supply voltage is provided on line L1, L2 and L3 by the power source 56. As indicated above, the three phase AC voltage is rectified by the three phased diode rectifier 42 to produce a DC output which is smoothed by the capacitor 74 placed between the +DC line and the −DC line of the DC link. This DC voltage is provided to the six transistors or switches $S_1$-$S_6$ of the three phase H-bridge inverter 44, which generates three phase voltage vectors using a special pattern of Pulse Width Modulated ("PWM") signals provided by the controller 40 as is further described below. The output signals of the inverter 44 are provided, in some cases over a long cable (including conductors 64, 66), to the U, V and W terminals of the motor 26.

Figure 4:
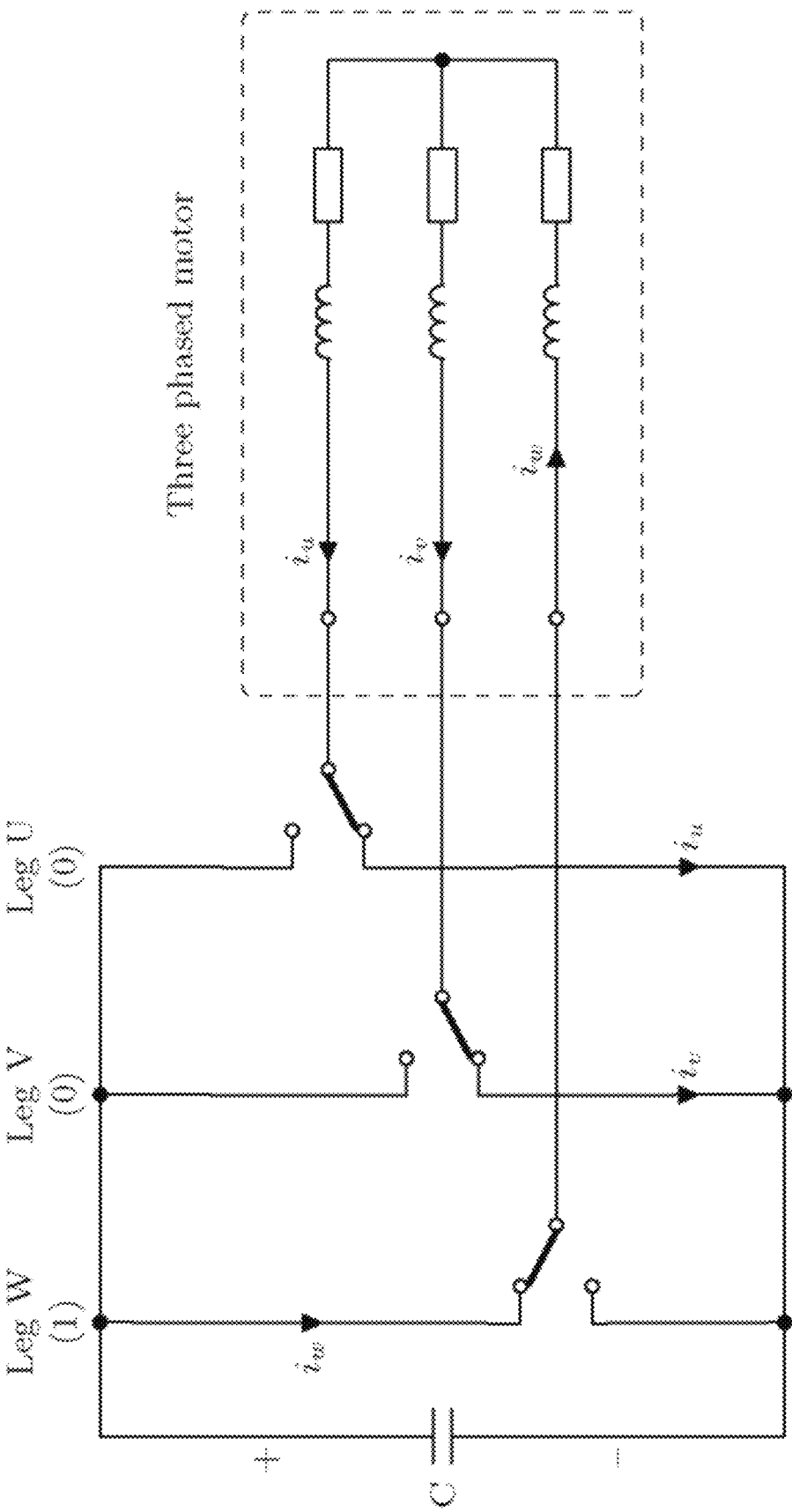
FIG. 4 is a simplified schematic diagram of the topology of FIG. 3.

FIG. 4 depicts a simplified version of the inverter topology of FIG. 3. In FIG. 4, the DC link is assumed to be constant. Typically, the DC link voltage varies somewhat with variations in the load demand, but for purposes of the high-speed switching in many applications, it may be treated as constant, and the rectifier 42 may be omitted. FIG. 4 further simplifies the topology of FIG. 3 by representing each leg (W, V and U) of the inverter 44 as having only one switch. This simplification is permissible because, generally speaking, only one of the switches of each leg should be closed at the same time. In the example shown, leg W has the upper switch $S_1$ closed, leg V has the lower switch $S_4$ closed, and leg U has the lower switch $S_6$ closed. The arrows labelled $i_w$, $i_v$ and $i_u$ indicate the direction of current flow from the +DC line to the −DC line. Given this simplified version of the inverter topology, it is readily apparent that there are three switches, each having two different positions (i.e., opened or closed). As such, the total number of switching configurations or states is eight (i.e., $2^3$).

Figure 5:
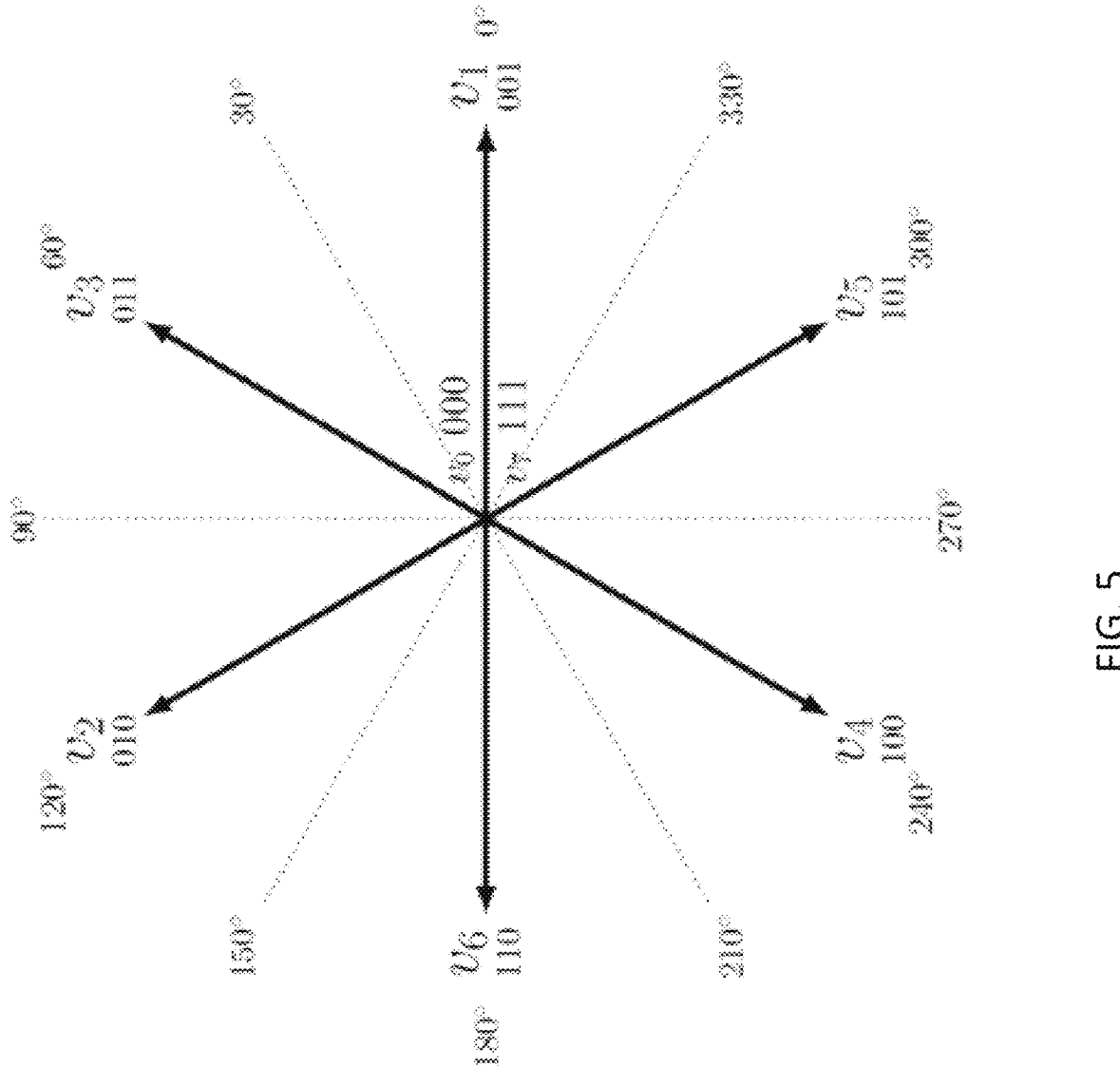

According to embodiments of the disclosure, the PWM technique to generate the output voltage of the inverter 44 is Space Vector Pulse Width Modulation ("SVPWM"), which is a modulation scheme for applying voltage vectors to the motor 26 that emulate a three phase sinusoidal waveform with adjustable amplitude and frequency. These voltage vectors may be represented as a rotating space vector of constant magnitude as depicted in FIGS. 5 and 6.

In SVPWM, the three phase voltage vectors are generated by synthesizing the voltage magnitude and phase angle traversing through the space vector hexagon. Each sector represents a 60-degree span of the full electrical cycle (i.e., 360 degrees). The state of the three switches represented in FIG. 4 (i.e., the eight switching configurations of 000, 001, 010, 011, 100, 101, 110 and 111) is used to create the six states of the sector boundaries (i.e., 001,010,011, 100, 101 and 110) also known as the active vectors V1 (001), V3 (011), V2 (010), V6 (110), V4 (100) and V5 (101). The other two states of 111 (all switches closed) and 000 (all switches opened) are called null states or zero vectors and are represented at the origin in FIG. 5.

In conventional SVPWM, the output voltage vector is created by repeatedly switching between adjacent vectors and the null vectors. The angle of the vector (i.e., between 0 and 360 degrees) is determined by relative ON time between two adjacent vectors. The magnitude is determined by relative ON time between two adjacent vectors and the null vectors. For example, to generate a three phase waveform at 30 Hz, 115 VAC line-line, the voltage vector will rotate through the space vector hexagon completing the whole 360 degrees in $\frac{1}{30}$ seconds. The magnitude of the voltage vector will be 0.5 per unit ("PU"), considering 230 Vac=1 PU. Such a voltage vector with a 30 degree angle ($\alpha$=30 degrees) and a 0.5 magnitude ($V_{ref}$=0.5 PU) is depicted in FIG. 6, and lies in the middle of sector 1 (bounded by states 011 and 001).

The switching period is the period of the switching frequency used to generate the voltage vectors. Still referring to FIG. 6, the following calculations are made to determine the time to spend in each state:

$$T_1 = T \cdot M \cdot \sin(60° - \alpha)$$

$$T_2 = T \cdot M \cdot \sin(\alpha)$$

$$T_0 = T - T1 - T2$$

$$M = \text{vector magnitude} (0 \text{ to } 1)$$

$$\alpha = \text{vector angle between } V_{ref} \text{ and } V_x (0° \text{ to } 60°)$$

$$T = \text{switching period}$$

As is further described below, T1, T2 and T0 can be expressed as duty cycles, D, where Di=Ti/T.

In certain embodiments of the present disclosure an Alternate-Reverse sequence of the null vector arrangement for each PWM cycle is used, providing the benefit of higher bus utilization. This sequence is the most popular configuration utilized in most SVPWM implementations. All the PWM signals are center aligned and active low (i.e., the switching periods start and end with a low logic state). As is known in the art, SVPWM has various benefits over regular sinusoidal PWM such as higher bus utilization, third harmonic injection, switching loss manipulation, as well as others.

Nonetheless, conventional SVPWM has shortcomings as well, including problems associated with large magnitude and high frequency common mode voltage ("CMV"). CMV causes electromagnetic interference ("EMI") and can have destructive effects on motor windings and insulation, as well as bearing failure for variable speed drives. The common mode current is defined as sum-total of all the currents flowing through the output conductors. Stray capacitances of the cable between the motor and the motor drive (i.e., motor conductors 64, 66) and internal to the motor are possible paths for this current and a source of EMI noise problems.

Figure 7:
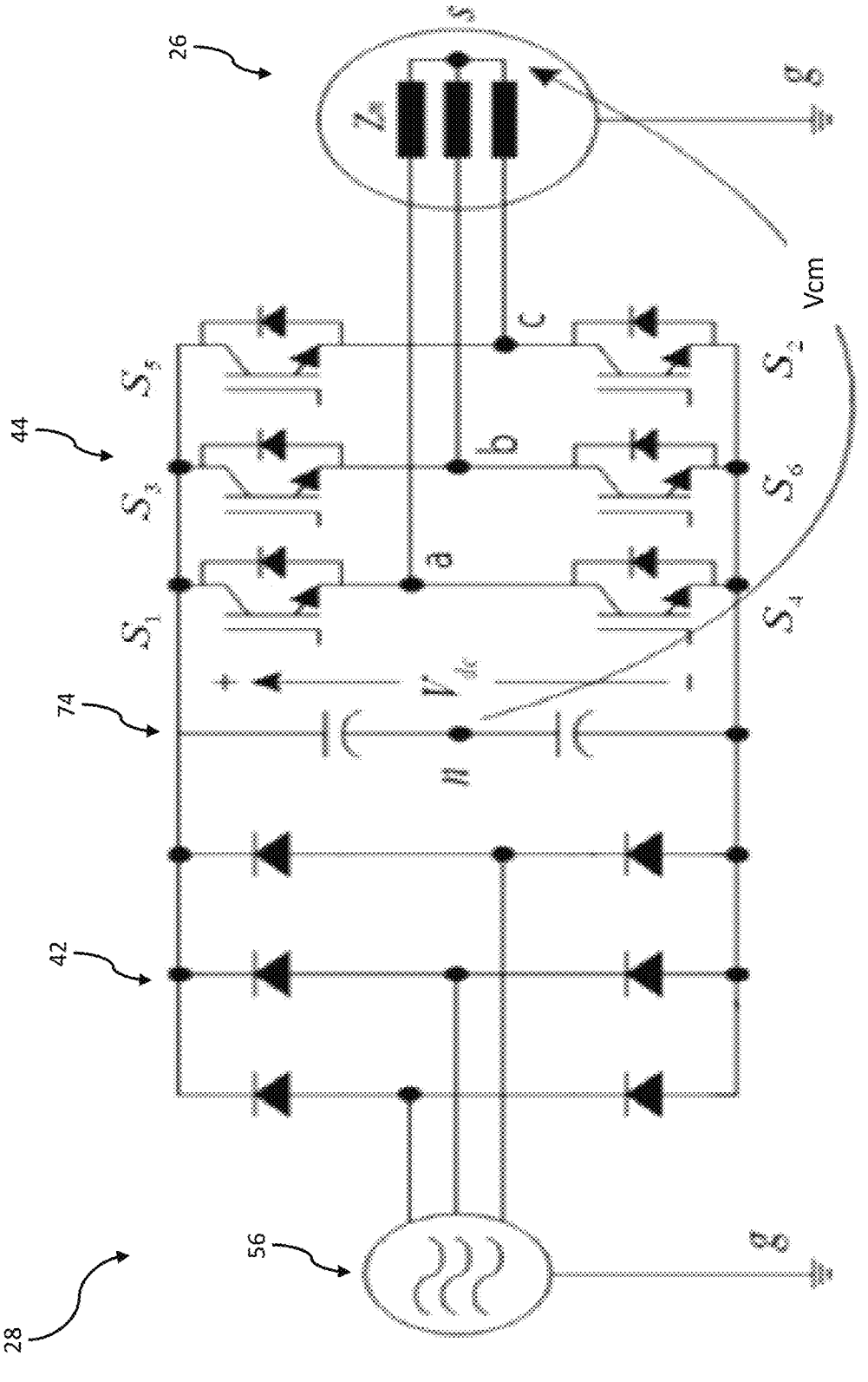
FIG. 7 is a schematic diagram of a prior art inverter topology for a motor drive.

Referring now to FIG. 7, CMV can be defined as the voltage difference at the neutral point between the three-phase load and the DC power (i.e., $V_{cm}$). $V_{cm}$ represents the sum of the voltages of the three poles of the inverter 44. Mathematically, $V_{cm}=(V_{an}+V_{bn}+V_{cn})/3$, where $V_{an}$ is the voltage across phase A and the neutral point, n, $V_{bn}$ is the voltage across phase B and the neutral point, n, and $V_{cn}$ is the voltage across phase C and the neutral point, n. Table 1 below shows $V_{cm}$ for each of the eight switching states $V_0$-$V_7$.

TABLE 1

| INVERTER POLE VOLTAGE AND CMV BY SWITCHING STATE | | | | |
|---|---|---|---|---|
| Switching state | Inverter pole voltage | | | |
| | $V_{an}$ | $V_{bn}$ | $V_{cn}$ | $V_{cm}$ |
| $V_0$ | $-V_{dc}/2$ | $-V_{dc}/2$ | $-V_{dc}/2$ | $-V_{dc}/2$ |
| $V_1$ | $+V_{dc}/2$ | $-V_{dc}/2$ | $-V_{dc}/2$ | $-V_{dc}/6$ |
| $V_2$ | $+V_{dc}/2$ | $+V_{dc}/2$ | $-V_{dc}/2$ | $+V_{dc}/6$ |
| $V_3$ | $-V_{dc}/2$ | $+V_{dc}/2$ | $-V_{dc}/2$ | $-V_{dc}/6$ |
| $V_4$ | $-V_{dc}/2$ | $+V_{dc}/2$ | $+V_{dc}/2$ | $+V_{dc}/6$ |
| $V_5$ | $-V_{dc}/2$ | $-V_{dc}/2$ | $+V_{dc}/2$ | $-V_{dc}/6$ |
| $V_6$ | $+V_{dc}/2$ | $-V_{dc}/2$ | $+V_{dc}/2$ | $+V_{dc}/6$ |
| $V_7$ | $+V_{dc}/2$ | $+V_{dc}/2$ | $+V_{dc}/2$ | $+V_{dc}/2$ |

As shown, for all of the active vectors, $V_1$-$V_6$, the common mode voltage $V_{cm}$ is either positive or negative $V_{dc}/6$, but the common mode voltage associated with the zero vectors, $V_0$ and $V_7$, is a much larger $-V_{dc}/2$ and $+V_{dc}/2$, respectively.

The common mode voltage problem associated with conventional SVPWM may be at least partially addressed using a technique known as Active Zero Space Vector Pulse Width Modulation ("AZSVPWM"). In AZSVPWM, instead of using null or zero vectors, two 180 degree opposite active vectors can be used to generate the same average voltage. By using an AZSPWM algorithm, the range of $V_{cm}$ can be reduced by ⅓ compared to SVPWM. The basic concept is to utilize two active vectors to synthesize the reference voltage vector, each active vector being 180 degree phase shifted, instead of two zero vectors, without affecting the linear modulation range. Therefore, the reference voltage vector is only composed of active vectors.

Figure 8:
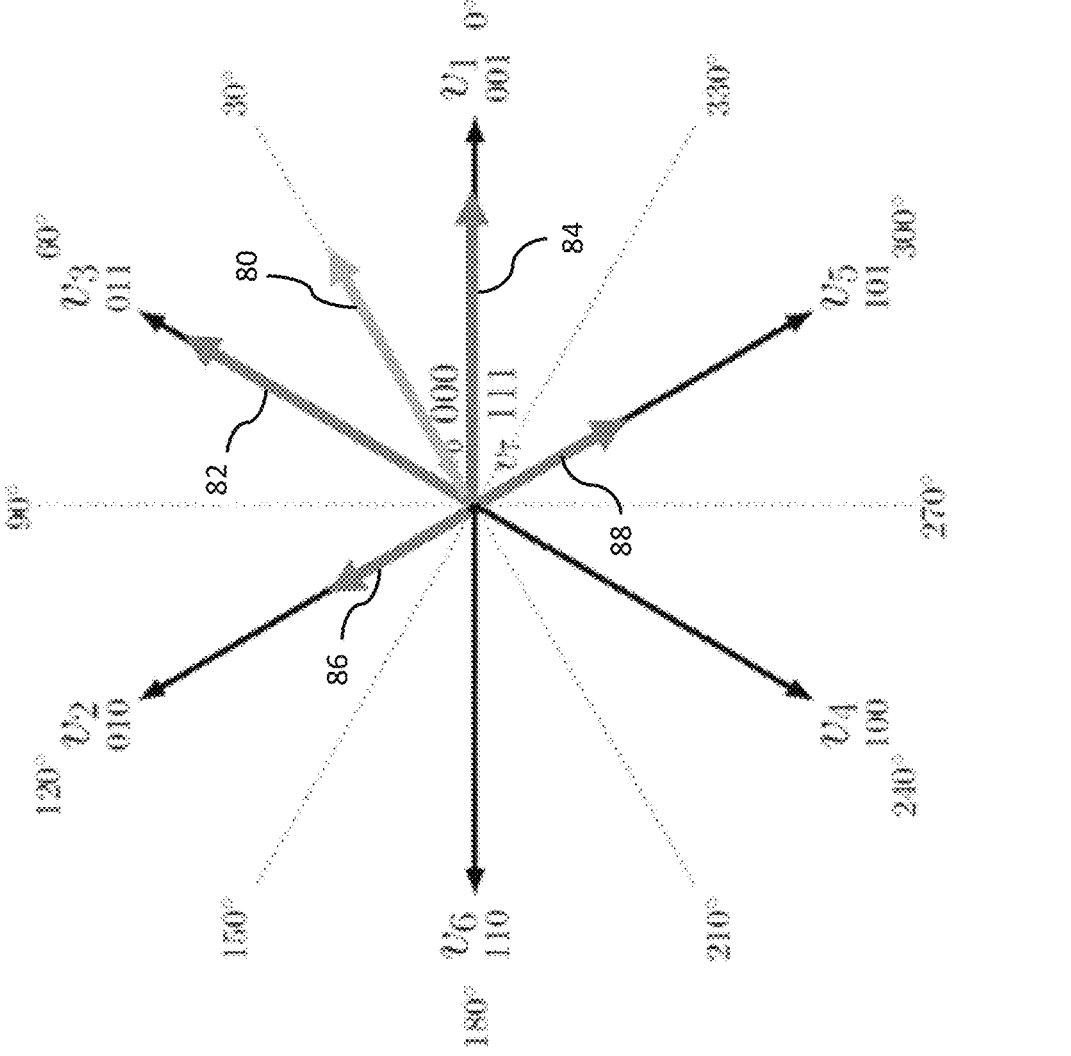
FIG. 8 is a space vector diagram showing a reference voltage vector synthesized using only active vectors according to an embodiment of the present disclosure.

FIG. 8 illustrates an example. To generate the reference voltage vector 80 in sector 1, the inverter 44 is controlled to switch between the $V_3$ and $V_1$ states (active vectors 82 and 84, respectively) as in standard SVPWM, but over the duration in which a zero vector, $V_0$ or $V_7$, is traditionally required, the $V_2$ and $V_5$ states are used instead (180 degree phase shifted active vectors 86 and 88, respectively). While this approach reduces $V_{cm}$, it does not eliminate it. The majority of the CMV is limited to the $+/-V_{dc}/6$ range, but when the voltage vector crosses from one sector to another, there are instances of CMV at $+/-V_{dc}/2$ for short durations due to 000 states occurring. This is caused by the dead band effect inserted by the PWM module to avoid a shoot-through situation.

Additionally, in applications such as deep well pumping systems where the motor drive 28 is separated from the pump unit 16 (see FIG. 1), the inverter 44 is connected to the motor 26 of the pump unit 16 by a long cable represented by motor conductors 64, 66 of FIG. 2. As used herein, the phrase "long cable" generally refers to a cable of sufficient length to extend from a surface location above a well to a location of a pump motor near the bottom of the well. In some applications, a long cable is over 1,000 feet long. In other applications, a long cable is over 500 feet long. In still other applications, a long cable is over 100 feet long. In still other embodiments, a long cable is over 50 feet long. As such, in these applications the longer cable lengths result in higher line-line voltages. In some applications, the cable (conductors 64, 66) connecting the motor drive 28 and the motor 26 is approximately 1,200 feet and the switching frequency is approximately 8 KHz. In such an application, a high peak line-line voltage at the terminals of the motor 26 occur near sector transitions. This reflected voltage occurs because AZSVPWM includes instances of complementary switching of vectors. Complementary switching of vectors is when any two phases change in different directions at the same time. One example would be when phase U upper transitions from high to low and phase V upper transitions from low to high at the same instance. This is depicted in FIG. 9.

Figure 9:
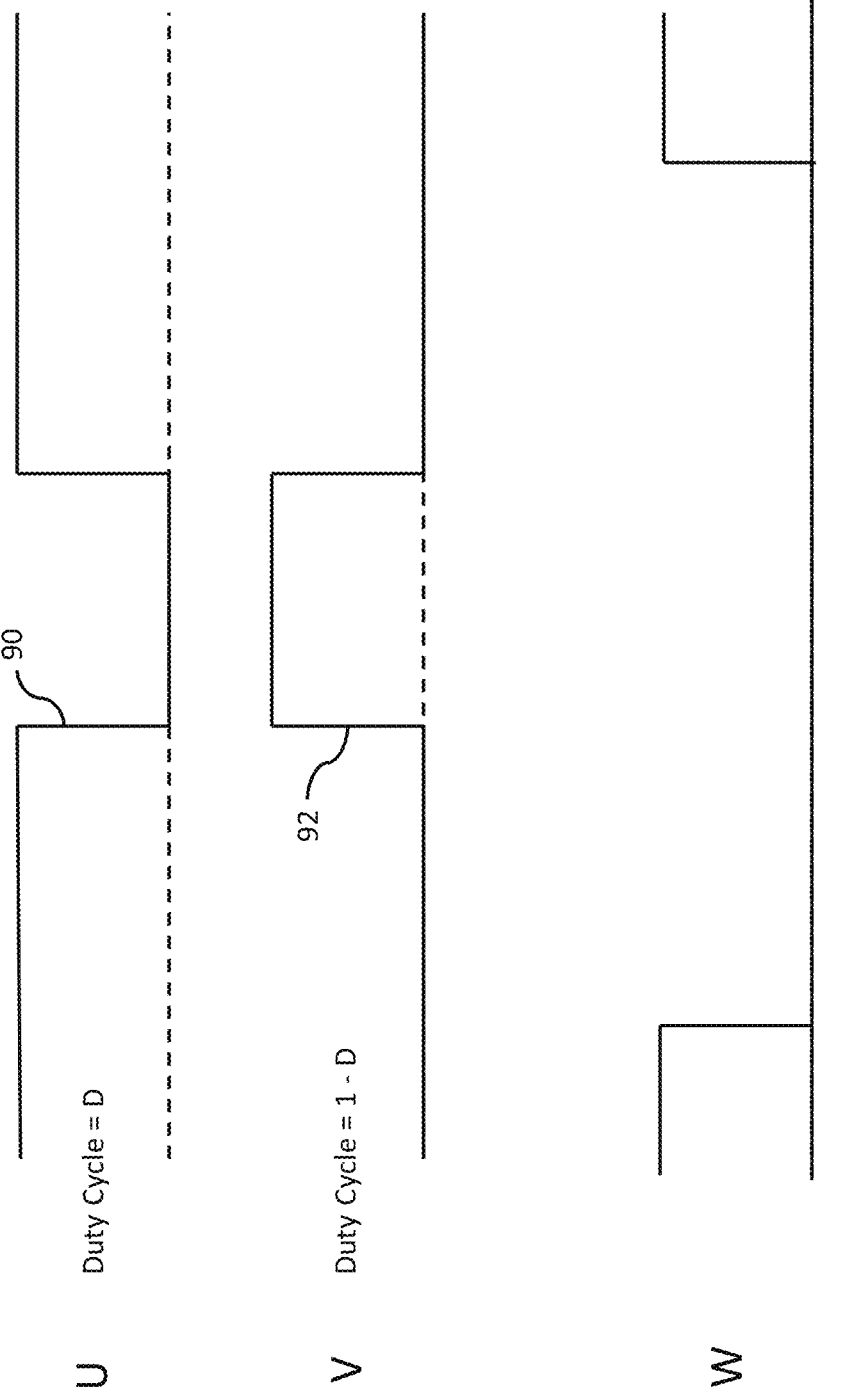
FIG. 9 is a graph showing voltage switching for each phase of an inverter output waveform.

As shown in FIG. 9, close to a sector transition there exist switching instances where phase U transitions from ON to OFF (i.e., at falling edge 90) while at nearly the same time phase V transitions from OFF to ON (i.e., at rising edge 92). This leads to a change in the UV line-line voltage from $+V_{dc}$ directly to $-V_{dc}$, rather than the typical transition from $+V_{dc}$ to 0 or from 0 to $-V_{dc}$. This phenomenon effectively doubles the peak reflected voltage and peak voltage observed at the motor 26. Thus, improvements to AZSVPWM techniques are needed to reduce common mode voltage, reflected voltage and the associated problems.

According to embodiments of the present disclosure, conventional AZSVPWM techniques are modified by manipulating the duty cycles of the active vectors when approaching a possible overlap as described above. The occurrences of $V_{dc}/2$ due to dead band and high peak reflected voltage due to complementary state switching occur at sector changes in which the value of an increasing (or decreasing) phase duty cycle plus a different phase duty cycle approaches unity as shown in FIG. 9. As described below, manipulation of the duty cycles of the active vectors removes these instances.

According to the present disclosure, a parameter for eliminating the $\pm V_{dc}/2$ common mode voltage and reducing the peak of the phase voltage at the motor leads over a long cable due to reflected voltage is defined as duty cycle offset or $d_{ov}$. $d_{ov}$ indirectly controls the direct transitions of the voltage that cause higher peaks of reflected voltage by ensuring the summation of duty cycles between two active states remains at an offset of $+/-d_{ov}$ from unity during motoring of the inverter 44. This is accomplished by manipulating the duty cycle as is further described below.

A linear curve is used to sweep the value of $d_{ov}$ based on the fundamental speed of the motor 26. In one embodiment, $d_{ov}=0.0008*\text{Fundamental Frequency}+0.016$. This is done to reduce the harmonic distortion caused by nullifying the effect of deadband in the AZSVPWM technique. A constant value of $d_{ov}$ may work well in terms of CMV for a wide range of motor speeds, but may also distort the fundamental waveform, which increases the harmonic distortion.

A ratio of $d_{ov}$ to the modulation index may be defined as $$k = \frac{d_{ov}}{M}.$$

The modulation index, M, also known as vector magnitude, is used in the calculation of duty cycles as is standard in SVPWM:

$$D_1 = M \cdot \sin(\alpha_{ref} - \alpha)$$

$$D_2 = M \cdot \sin(\alpha)$$

$$D_0 = 1 - D_1 - D_2$$

where $\alpha$ is the vector angle, decrementing from 60 degrees to 0 degrees within a sector and $\alpha_{ref}$ is the sector span of 60 degrees.

A decision angle within the sector wherein "notching" of the duty cycle waveform begins or ends may be defined as:

$$\alpha' = k + \frac{1}{6}k^3$$

The term "notching" is used to refer to the holding of the duty cycles to $D_{high}$ or $D_{low}$ for an angle duration of a' at specific instances throughout the duty cycle waveform. $D_{high}$ and $D_{low}$ may be defined as follows:

$$D_{high} = \frac{1}{2} + \frac{\sqrt{3}}{2}M \cdot \sin\left(\frac{\alpha_{ref}}{2} - \alpha'\right)$$

$$D_{low} = \frac{1}{2} - \frac{\sqrt{3}}{2}M \cdot \sin\left(\frac{\alpha_{ref}}{2} - \alpha'\right)$$

The duty cycle is manipulated based on the phase trend or angle, α, (i.e., increasing or decreasing) traversing within the sector. The value of α is increasing if 0° is the beginning of the sector and 60° is the end of the sector. The value of α is decreasing if 60° is the beginning of the sector and 0° is the end of the sector. The following rules are collectively referred to as "the duty cycle manipulation rules" or "the DCMRs":

For an increasing duty cycle within a sector:
if α<α', then the duty cycle is set to $D_{high}$.
if α>($\alpha_{ref}$–α'), then the duty cycle is set to $D_{low}$.
For all other values of α, the duty cycle remains unchanged from the
$D_1$, $D_2$ and $D_0$ determinations described above.
For decreasing duty-cycle within a sector:
if α<α', then the duty cycle is set to $D_{low}$.
if α>($\alpha_{ref}$–α'), then the duty cycle is set to $D_{high}$.
For all other values of α, the duty cycle remains unchanged from the $D_1$, $D_2$ and $D_0$ determinations described above.

Figures 10A, 10B:
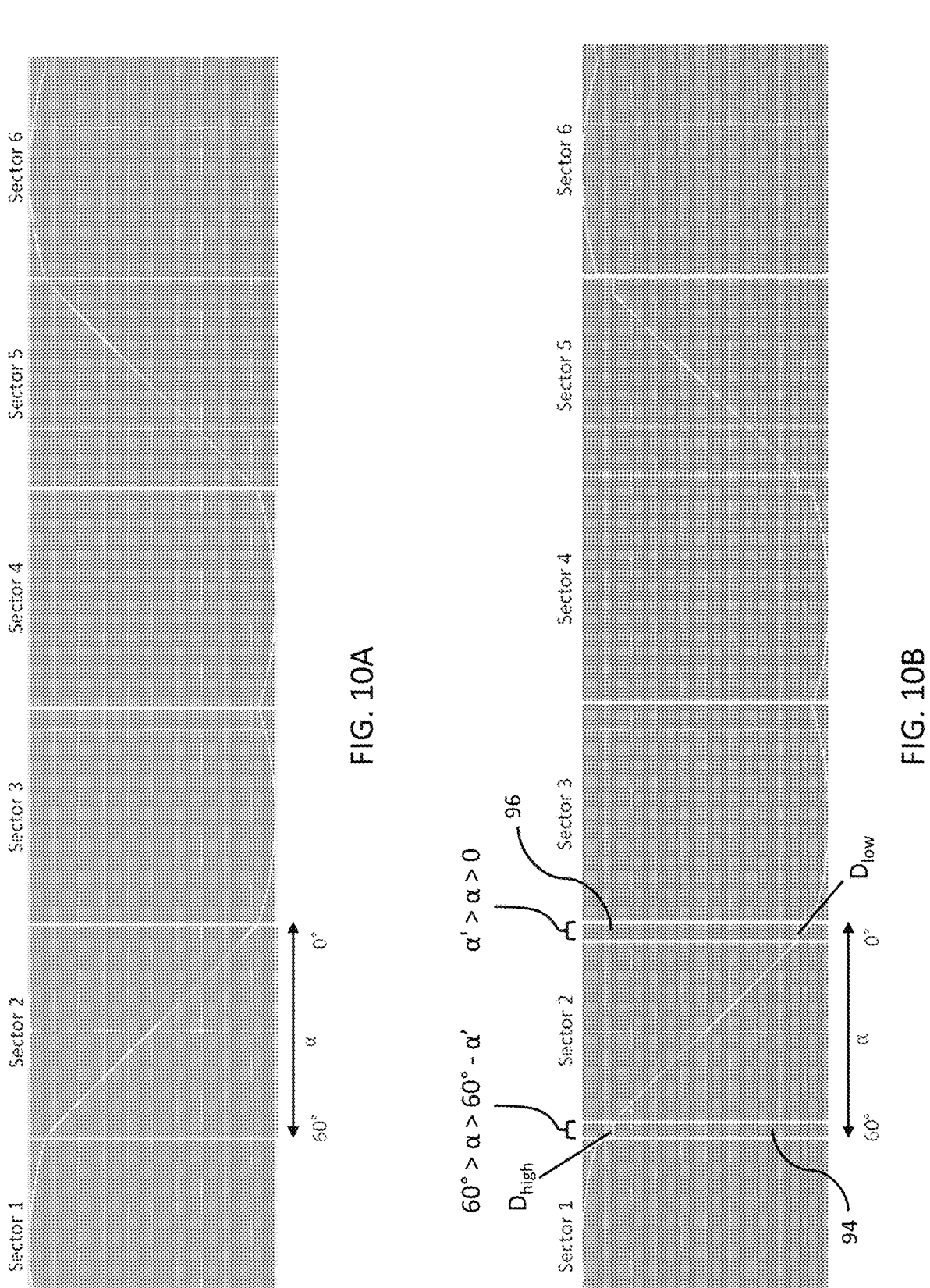
FIG. 10A is a plot of a duty cycle waveform for all six sectors using a standard duty cycle calculation.
FIG. 10B is a plot of a duty cycle waveform for all six sectors using a set of duty cycle manipulation rules according to the present disclosure.

FIG. 10A is an example plot of a duty cycle waveform of phase U for all six sectors (i.e., 0° through) 360°, resulting from the standard calculation of $D_1$, $D_2$ and $D_0$. FIG. 10B, on the other hand, is an example plot of the same U phase duty cycle waveform after implementing the DCMRs described above. As shown, in the region labelled 94 the duty cycle is set to $D_{high}$ and in the region labelled 96 the duty cycle is set to $D_{low}$. In the examples of FIGS. 10A and 10B, the modulation index, M, is 1 and a duty cycle offset ($d_{ov}$) of 0.08 is used.

The above-described DCMRs are applied to all sectors of the space vector hexagon based upon the active sector and duty cycle trend (i.e., increasing or decreasing). Table 2 shows which phase is subject to the duty cycle manipulation rules for each sector and each duty cycle trend within the sector.

TABLE 2

| Sector | Rotation Direction | Phase subject to DCMRs |
|---|---|---|
| 1 (0° to 60°) | Forward | V |
| 1 (0° to 60°) | Reverse | V |
| 2 (60° to 120°) | Forward | U |
| 2 (60° to 120°) | Reverse | U |
| 3 (120° to 180°) | Forward | W |
| 3 (120° to 180°) | Reverse | W |
| 4 (180° to 240°) | Forward | V |

TABLE 2-continued

| Sector | Rotation Direction | Phase subject to DCMRs |
|---|---|---|
| 4 (180° to 240°) | Reverse | V |
| 5 (240° to 300°) | Forward | U |
| 5 (240° to 300°) | Reverse | U |
| 6 (300° to 360°) | Forward | W |
| 6 (300° to 360°) | Reverse | W |

Referring now to FIG. 11A, example waveforms are shown for each standard AZSVPWM output signal $V_{ab}$, $V_{bc}$ and $V_{ca}$ along with the corresponding values for the common mode voltage $V_{cm}$ for 60 Hertz operation. As shown, there are points (labelled 100) on each of the waveforms corresponding to the voltage vector crossing from one sector to another. The common mode voltage, $V_{cm}$, corresponding to these points is shown as spikes 102 which reach a maximum value of $\pm V_{dc}/2$, leading to higher common mode current and the associated problems described above.

Figures 12A, 12B:
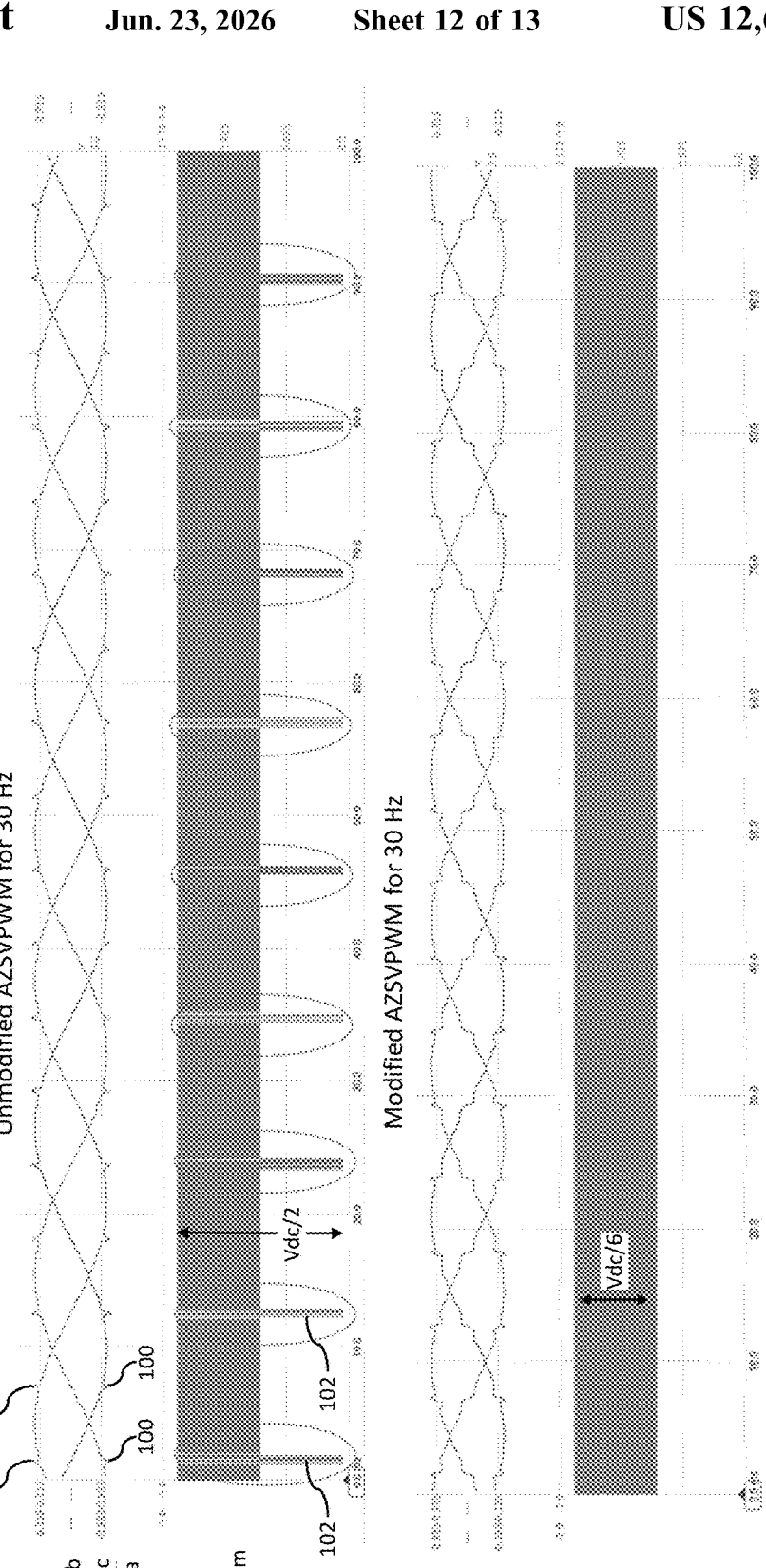
FIGS. 12A and 12B are similar to FIGS. 11A and 11B, respectively, but for 30 Hertz operation.

Referring to FIG. 11B, a similar graph is provided to depict the results of modifying the standard AZSVPWM approach according to the teachings of the present disclosure. Example waveforms are shown for each AZSVPWM output signal (modified by the duty cycle manipulation rules described herein) $V_{ab}$, $V_{bc}$ and $V_{ca}$ along with the corresponding values for the common mode voltage $V_{cm}$ for 60 Hertz operation. As shown, by implementing the logic of the present disclosure, the common mode voltage, $V_{cm}$, may be strictly limited to $\pm V_{dc}/6$, resulting in a decrease in common mode current. FIGS. 12A and 12B show similar results for 30 Hertz operation.

As indicated above, the parameter $d_{ov}$ for eliminating the $\pm V_{dc}/2$ common mode voltage and reducing the peak of the phase voltage at the motor leads over a long cable due to reflected voltage may be varied based on the frequency of operation of the motor drive 28, which will result in a different peak voltage at the motor 26 assuming a constant length for the cable connecting the motor drive 28 and the motor 26. Example values for $d_{ov}$ and the resulting peak voltage at different operating frequencies are shown in Table 3 for a cable length of 1,200 feet.

TABLE 3

| $d_{ov}$ | Motor Frequency (Hz) | Peak Voltage (V) |
|---|---|---|
| 0.045 | 60 | 1140 |
| 0.060 | 60 | 1090 |
| 0.080 | 60 | 1020 |
| 0.060 | 30 | 970 |
| 0.080 | 30 | 930 |
| 0.100 | 30 | 930 |
| 0.050 | 12 | 1000 |
| 0.070 | 12 | 1020 |
| 0.080 | 12 | 1100 |
| 0.045 | 70 | 1050 |
| 0.055 | 70 | 1020 |
| 0.060 | 70 | 1020 |
| 0.080 | 70 | 1020 |
| 0.200 | 70 | 1020 |

As shown in Table 3, varying the parameter $d_{ov}$ affects the peak voltage seen at the motor terminals with longer cables. Appropriate selection of the value of $d_{ov}$ for a particular operating frequency can reduce the peak voltage for the required cable length. For example, at 60 Hertz operating frequency, the lowest peak voltage of 1,020 V corresponds to $d_{ov}$=0.080. At 30 Hertz operating frequency, $d_{ov}$ values of 0.080 and higher yield the lowest peak voltage of 930 V. At 12 Hertz operating frequency, the lowest peak voltage of 1,000 V corresponds to a $d_{ov}$ value of 0.050. Finally, at 70 Hertz operating frequency, $d_{ov}$ values of 0.055 and greater result in the lowest peak voltage of 1,020 V. Other values of $d_{ov}$ may be used in other applications and with other cable lengths.

Figures 13A, 13B:
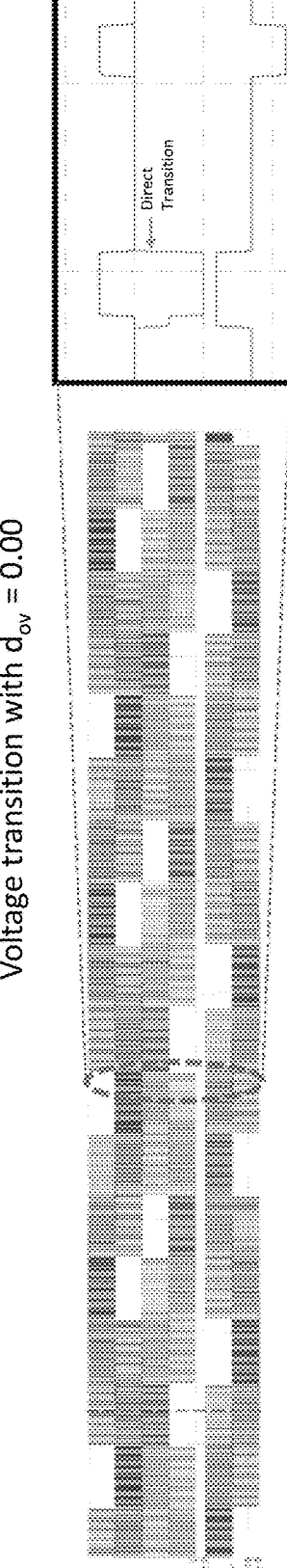
FIG. 13A is a plot depicting a voltage transition when a duty cycle offset parameter according to the present disclosure is set to 0.00.
FIG. 13B is a plot depicting the elimination of the voltage transition shown in FIG. 13A when the duty cycle offset parameter is set to 0.08.

Referring now to FIGS. 13A and 13B, the effect of $d_{ov}$ of eliminating direct transitions from $+V_{dc}$ to $-V_{dc}$ (or vice versa) using the DCMRs described above is shown graphically. In FIG. 13A, $d_{ov}$ is equal to 0.00. As shown in the enlarged portion of the figure, when $V_{ab}$ transitions from high to low $V_{bc}$ transitions from low to high. This results in a direct transition as described above. As shown in the enlarged portion of FIG. 13B, where $d_{ov}$ is equal to 0.08, the direct transition is eliminated. Such direct transitions in phase-to-phase causes voltage swings from $+V_{dc}$ to $-V_{dc}$ or $-V_{dc}$ to $+V_{dc}$ which creates higher reflected voltages with long motor leads at the terminals of the motor 26. As described above, this high voltage can cause corona effects and, if the voltage reaches a high enough level, can result in damage or even complete failure of the motor windings.

As should be understood from the foregoing, the teachings of the present disclosure may be implemented solely in software. As such, the need for a large common mode choke (i.e., a passive electromagnetic device that permits the passage of the desired electrical signals while filtering out the unwanted high-frequency noise signals) is eliminated. This permits a substantial reduction in the size and cost of the hardware used to implement the motor drive 28.

Any directional references used with respect to any of the figures, such as right or left, up or down, or top or bottom, are intended for convenience of description, and do not limit the present disclosure or any of its components to any particular positional or spatial orientation. Additionally, any reference to rotation in a clockwise direction or a counterclockwise direction is simply illustrative. Any such rotation may be implemented in the reverse direction as that described herein.

Although the foregoing text sets forth a detailed description of embodiments of the disclosure, it should be understood that the legal scope of the invention is defined by the words of the claims set forth at the end of this patent and equivalents. The detailed description is to be construed as exemplary only and does not describe every possible embodiment. Numerous alternative embodiments may be implemented, using either current technology or technology developed after the filing date of this patent, which would still fall within the scope of the claims.

The following additional considerations apply to the foregoing description. Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

In various embodiments, a hardware module may be implemented mechanically or electronically. For example, a hardware module may comprise dedicated circuitry or logic that is permanently configured (e.g., as a special-purpose processor, such as a field programmable gate array (FPGA) or an application-specific integrated circuit (ASIC)) to perform certain operations. A hardware module may also comprise programmable logic or circuitry (e.g., as encompassed within a general-purpose processor or other programmable processor) that is temporarily configured by software to perform certain operations. It will be appreciated that the decision to implement a hardware module mechanically, in dedicated and permanently configured circuitry, or in temporarily configured circuitry (e.g., configured by software) may be driven by cost and time considerations.

Accordingly, the term "hardware module" should be understood to encompass a tangible entity, be that an entity that is physically constructed, permanently configured (e.g., hardwired), or temporarily configured (e.g., programmed) to operate in a certain manner or to perform certain operations described herein. Considering embodiments in which hardware modules are temporarily configured (e.g., programmed), each of the hardware modules need not be configured or instantiated at any one instance in time. For example, where the hardware modules comprise a general-purpose processor configured using software, the general-purpose processor may be configured as respective different hardware modules at different times. Software may accordingly configure a processor, for example, to constitute a particular hardware module at one instance of time and to constitute a different hardware module at a different instance of time.

Hardware modules may provide information to, and receive information from, other hardware modules. Accordingly, the described hardware modules may be regarded as being communicatively coupled. Where multiple of such hardware modules exist contemporaneously, communications may be achieved through signal transmission (e.g., over appropriate circuits and buses) that connect the hardware modules. In embodiments in which multiple hardware modules are configured or instantiated at various times, communications between such hardware modules may be achieved, for example, through the storage and retrieval of information in memory structures to which the multiple hardware modules have access. For example, one hardware module may perform an operation and store the output of that operation in a memory device to which it is communicatively coupled. A further hardware module may then, at a later time, access the memory device to retrieve and process the stored output. Hardware modules may also initiate communications with input or output devices, and may operate on a resource (e.g., a collection of information).

The various operations of example methods described herein may be performed, at least partially, by one or more processors that are temporarily configured (e.g., by software) or permanently configured to perform the relevant operations. In certain embodiments, the methods are performed by a controller that executes non-transitory computer-readable instructions stored on a memory device. Whether temporarily or permanently configured, such processors may constitute processor-implemented modules that operate to perform one or more operations or functions. The modules referred to herein may, in some example embodiments, comprise processor-implemented modules.

Similarly, the methods or routines described herein may be at least partially processor-implemented. For example, at least some of the operations of a method may be performed by one or more processors or processor-implemented hardware modules. The performance of certain of the operations may be distributed among the one or more processors, not only residing within a single machine, but deployed across a number of machines. In some example embodiments, the processor or processors may be located in a single location (e.g., within a home environment, an office environment or as a server farm), while in other embodiments the processors may be distributed across a number of locations.

The performance of certain of the operations may be distributed among the one or more processors, not only residing within a single machine, but deployed across a number of machines. In some example embodiments, the one or more processors or processor-implemented modules may be located in a single device or geographic location (e.g., within a home environment, an office environment, or a server farm). In other example embodiments, the one or more processors or processor-implemented modules may be distributed across a number of devices or geographic locations.

Unless specifically stated otherwise, use herein of words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

Additionally, some embodiments may be described using the expression "communicatively coupled," which may mean (a) integrated into a single housing, (b) coupled using wires, or (c) coupled wirelessly (i.e., passing data/commands back and forth wirelessly) in various embodiments.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus.

In addition, use of the "a" or "an" are employed to describe elements and components of the embodiments herein. This is done merely for convenience and to give a general sense of the description. This description, and the claims that follow, should be read to include one or at least one and the singular also includes the plural unless it is obvious that it is meant otherwise.

The patent claims at the end of this patent application are not intended to be construed under 35 U.S.C. § 112 (f) unless traditional means-plus-function language is expressly recited, such as "means for" or "step for" language being explicitly recited in the claim(s).

What is claimed is:

1. A method for reducing common mode voltages in a three-phase pulse width modulated ("PWM") system that includes a controller and an inverter connected to a motor by a long cable, the method comprising:

controlling, by the controller, operation of switches of the inverter to generate voltage vectors provided to the motor over the cable that emulate a three-phase sinusoidal waveform with an adjustable amplitude and an adjustable frequency, the voltage vectors being generated by switching between a pair of adjacent active vectors of a space vector hexagon and a pair of active vectors that are separated by 180 degrees on the space vector hexagon;

determining, by the controller, whether a phase angle of the voltage vectors is increasing or decreasing within a sector of the space vector hexagon;

determining, by the controller, a decision angle within the sector which is a function of a duty cycle offset and a modulation index; and comparing, by the controller, the phase angle to the decision angle to apply duty cycle manipulation rules, including:

responding, by the controller, to an increasing phase angle that is less than the decision angle by setting a duty cycle of the pair of adjacent active vectors to a duty cycle high value;

responding, by the controller, to an increasing phase angle that is greater than 60 degrees minus the decision angle by setting the duty cycle to a duty cycle low value;

responding, by the controller, to a decreasing phase angle that is less than the decision angle by setting the duty cycle to the duty cycle low value; and responding, by the controller, to a decreasing phase angle that is greater than 60 degrees minus the decision angle by setting the duty cycle to the duty cycle high value.

2. The method of claim 1, wherein the cable is at least 50 feet long.

3. The method of claim 1, wherein the duty cycle high value and the duty cycle low value are each a function of the modulation index and the decision angle.

4. The method of claim 1, wherein determining whether the phase angle of the voltage vectors is increasing or decreasing within a sector of the space vector hexagon includes determining that the phase angle is increasing if 0 degrees is the beginning of the sector and 60 degrees is the end of the sector, and determining that the phase angle is decreasing if 60 degrees is the beginning of the sector and 0 degrees is the end of the sector.

5. The method of claim 1, further comprising responding, by the controller, to an increasing phase angle that is greater than the decision angle and less than 60 degrees minus the decision angle by leaving the duty cycle unchanged, and responding, by the controller, to a decreasing phase angle that is greater than the decision angle and less than 60 degrees minus the decision angle by leaving the duty cycle unchanged.

6. The method of claim 1, wherein in sector one of the space vector hexagon the duty cycle manipulation rules are applied to a V phase of the three-phase sinusoidal waveform provided to the motor, in sector two of the space vector hexagon the duty cycle manipulation rules are applied to a U phase of the three-phase sinusoidal waveform provided to the motor, in sector three of the space vector hexagon the duty cycle manipulation rules are applied to a W phase of the three-phase sinusoidal waveform provided to the motor, in sector four of the space vector hexagon the duty cycle manipulation rules are applied to the V phase of the three-phase sinusoidal waveform provided to the motor, in sector five of the space vector hexagon the duty cycle manipulation rules are applied to the U phase of the three-phase sinusoidal waveform provided to the motor, and in sector six of the space vector hexagon the duty cycle manipulation rules are applied to the W phase of the three-phase sinusoidal waveform provided to the motor.

7. The method of claim 1, wherein the duty cycle offset is selected to reduce a peak voltage at the motor for a certain operating frequency of the motor.

8. The method of claim 1, further comprising sweeping a value of the duty cycle offset over a range of values corresponding to a linear curve based upon a speed of the motor.

9. A system for reducing common mode voltages in a three-phase pulse width modulated ("PWM") system for a motor, comprising:

a controller;

a memory device storing instructions; and an inverter controlled by the controller according to the instructions;

wherein execution of the instructions by the controller causes the controller to:

control operation of switches of the inverter to generate voltage vectors provided to the motor over a cable that emulate a three-phase sinusoidal waveform with an adjustable amplitude and an adjustable frequency, the voltage vectors being generated by switching between a pair of adjacent active vectors of a space vector hexagon and a pair of active vectors that are separated by 180 degrees on the space vector hexagon;

determine whether a phase angle of the voltage vectors is increasing or decreasing within a sector of the space vector hexagon;

determine a decision angle within the sector which is a function of a duty cycle offset and a modulation index; and compare the phase angle to the decision angle to apply duty cycle manipulation rules, including:

responding to an increasing phase angle that is less than the decision angle by setting a duty cycle of the pair of adjacent active vectors to a duty cycle high value;

responding to an increasing phase angle that is greater than 60 degrees minus the decision angle by setting the duty cycle to a duty cycle low value;

responding to a decreasing phase angle that is less than the decision angle by setting the duty cycle to the duty cycle low value; and responding to a decreasing phase angle that is greater than 60 degrees minus the decision angle by setting the duty cycle to the duty cycle high value.

10. The system of claim 9, wherein the cable is at least 50 feet long.

11. The system of claim 9, wherein the duty cycle high value and the duty cycle low value are each a function of the modulation index and the decision angle.

12. The system of claim 9, wherein execution by the controller of the instructions causes the controller to determine whether the phase angle of the voltage vectors is increasing or decreasing within a sector of the space vector hexagon by determining that the phase angle is increasing if 0 degrees is the beginning of the sector and 60 degrees is the end of the sector, and determining that the phase angle is decreasing if 60 degrees is the beginning of the sector and 0 degrees is the end of the sector.

13. The system of claim 9, wherein execution by the controller of the instructions further causes the controller to respond to an increasing phase angle that is greater than the decision angle and less than 60 degrees minus the decision angle by leaving the duty cycle unchanged, and respond to a decreasing phase angle that is greater than the decision angle and less than 60 degrees minus the decision angle by leaving the duty cycle unchanged.

14. The system of claim 9, wherein in sector one of the space vector hexagon the controller applies the duty cycle manipulation rules to a V phase of the three-phase sinusoidal waveform provided to the motor, in sector two of the space vector hexagon the controller applies the duty cycle manipulation rules to a U phase of the three-phase sinusoidal waveform provided to the motor, in sector three of the space vector hexagon the controller applies the duty cycle manipulation rules to a W phase of the three-phase sinusoidal waveform provided to the motor, in sector four of the space vector hexagon the controller applies the duty cycle manipulation rules to the V phase of the three-phase sinusoidal waveform provided to the motor, in sector five of the space vector hexagon the controller applies the duty cycle manipulation rules to the U phase of the three-phase sinusoidal waveform provided to the motor, and in sector six of the space vector hexagon the controller applies the duty cycle manipulation rules to the W phase of the three-phase sinusoidal waveform provided to the motor.

15. The system of claim 9, wherein the duty cycle offset is selected to reduce a peak voltage at the motor for a certain operating frequency of the motor.

16. The system of claim 9, wherein execution of the instructions by the controller further causes the controller to sweep a value of the duty cycle offset over a range of values corresponding to a linear curve based upon a speed of the motor.

17. A non-transitory computer-readable medium with an executable program stored thereon for reducing common mode voltages in a three-phase pulse width modulated ("PWM") system that includes an inverter connected to a motor by a long cable, wherein the program instructs a controller to perform the following steps:

controlling operation of switches of the inverter to generate voltage vectors provided to the motor over the cable that emulate a three-phase sinusoidal waveform with an adjustable amplitude and an adjustable frequency, the voltage vectors being generated by switching between a pair of adjacent active vectors of a space vector hexagon and a pair of active vectors that are separated by 180 degrees on the space vector hexagon;

determining whether a phase angle of the voltage vectors is increasing or decreasing within a sector of the space vector hexagon;

determining a decision angle within the sector which is a function of a duty cycle offset and a modulation index; and comparing the phase angle to the decision angle to apply duty cycle manipulation rules, including:

responding to an increasing phase angle that is less than the decision angle by setting a duty cycle of the pair of adjacent active vectors to a duty cycle high value;

responding to an increasing phase angle that is greater than 60 degrees minus the decision angle by setting the duty cycle to a duty cycle low value;

responding to a decreasing phase angle that is less than the decision angle by setting the duty cycle to the duty cycle low value; and responding to a decreasing phase angle that is greater than 60 degrees minus the decision angle by setting the duty cycle to the duty cycle high value.

18. The non-transitory computer-readable medium of claim 17, wherein the duty cycle high value and the duty cycle low value are each a function of the modulation index and the decision angle.

19. The non-transitory computer-readable medium of claim 17, wherein the program further instructs the controller to determine whether the phase angle of the voltage vectors is increasing or decreasing within a sector of the space vector hexagon by determining that the phase angle is increasing if 0 degrees is the beginning of the sector and 60 degrees is the end of the sector, and determining that the phase angle is decreasing if 60 degrees is the beginning of the sector and 0 degrees is the end of the sector.

20. The non-transitory computer-readable medium of claim 17, wherein the program further instructs the controller to sweep a value of the duty cycle offset over a range of values corresponding to a linear curve based upon a speed of the motor.

\* \* \* \* \*